United States Patent
Aksoy et al.

(10) Patent No.: US 11,216,026 B2
(45) Date of Patent: Jan. 4, 2022

(54) MAINBOARD AND DISPLAY PANEL

(71) Applicant: Vestel Elektronik Sanayi ve Ticaret A.S., Manisa (TR)

(72) Inventors: Berkin Aksoy, Manisa (TR); Ferhat Özmen, Manisa (TR); Onur Akdemir, Manisa (TR)

(73) Assignee: VESTEL ELEKTRONIK SANAYI VE TICARET A.S., Manisa (TR)

( * ) Notice: Subject to any disclaimer, the term of this patent is extended or adjusted under 35 U.S.C. 154(b) by 0 days.

(21) Appl. No.: 16/648,630

(22) PCT Filed: Dec. 27, 2017

(86) PCT No.: PCT/EP2017/084661
§ 371 (c)(1),
(2) Date: Mar. 18, 2020

(87) PCT Pub. No.: WO2019/052679
PCT Pub. Date: Mar. 21, 2019

(65) Prior Publication Data
US 2020/0285270 A1     Sep. 10, 2020

(30) Foreign Application Priority Data
Sep. 18, 2017 (EP) ................... 17191647

(51) Int. Cl.
*G06F 1/16* (2006.01)
*H05K 5/00* (2006.01)
(Continued)

(52) U.S. Cl.
CPC .......... *G06F 1/1601* (2013.01); *H01R 12/75* (2013.01); *H01R 35/04* (2013.01); *H04N 5/64* (2013.01);
(Continued)

(58) Field of Classification Search
CPC ....... G06F 1/1601; H01R 12/75; H01R 35/04; H04N 5/64; H05K 5/0017; H05K 5/0217; H05K 5/0247
See application file for complete search history.

(56) References Cited

U.S. PATENT DOCUMENTS 6,290,517 B1 * 9/2001 Anderson ............. G06F 1/1616
439/131
6,330,041 B1 * 12/2001 Park ...................... G06F 1/1601
312/7.2
(Continued)

FOREIGN PATENT DOCUMENTS

CN     200983271 Y     11/2007
EP     1684509 A2      7/2006

OTHER PUBLICATIONS

English translation of CN 200983271 published on Nov. 28, 2007 (4 pages).
(Continued)

*Primary Examiner* — Abhishek M Rathod
(74) *Attorney, Agent, or Firm* — Brandon V. Zuniga; James R. Gourley; Carstens & Cahoon, LLP

(57) ABSTRACT

A mainboard for a display panel has at least one socket for receiving a cable. The socket is rotatable between first and second orientations. This enables the socket to be oriented to face sideways if the display panel is mounted on a wall and to face rearwards if the display panel is not mounted on a wall.

16 Claims, 2 Drawing Sheets

(51) Int. Cl.
*H05K 5/02* (2006.01)
*H01R 12/75* (2011.01)
*H01R 35/04* (2006.01)
*H04N 5/64* (2006.01)

(52) U.S. Cl.
CPC ......... *H05K 5/0017* (2013.01); *H05K 5/0217* (2013.01); *H05K 5/0247* (2013.01)

(56) References Cited

U.S. PATENT DOCUMENTS

| | | | | |
|---|---|---|---|---|
| 6,683,390 B2* | 1/2004 | Miura | ................ | G11B 17/032 307/10.1 |
| 7,200,002 B2* | 4/2007 | Peng | ................ | G06F 1/181 361/679.33 |
| 7,217,144 B1* | 5/2007 | Cipolla | ................ | H01R 13/73 439/10 |
| 7,753,684 B1* | 7/2010 | Chuang | ................ | H01R 12/716 439/31 |
| 10,540,313 B2* | 1/2020 | Huang | ................ | G06F 13/14 |
| 2005/0280981 A1 | 12/2005 | Chen | | |
| 2008/0123284 A1* | 5/2008 | Jaramillo | ................ | H05K 7/1494 361/679.1 |
| 2008/0254684 A1* | 10/2008 | Tracy | ................ | H01R 35/04 439/620.21 |
| 2009/0069918 A1 | 3/2009 | Seo | | |
| 2009/0137155 A1 | 5/2009 | Yeh | | |
| 2010/0165569 A1* | 7/2010 | Lai | ................ | G06F 1/1616 361/679.55 |
| 2011/0261519 A1* | 10/2011 | Chiu | ................ | G06F 1/1616 361/679.02 |
| 2013/0107465 A1* | 5/2013 | Huang | ................ | G06F 1/166 361/725 |
| 2014/0328010 A1 | 11/2014 | Lin | | |
| 2015/0320203 A1* | 11/2015 | Mandon | ................ | A47B 21/06 108/20 |

OTHER PUBLICATIONS

Advertisement for (Pack of 2) 90 degree right angle hdmi adapter female to male, 90 degree hdmi bend-pjp electronics, available on the Internet at: https://www.amazon.co.uk/degree-right-adapter-female-electronics/dp/B003RIRUQO (1 page).

* cited by examiner

MAINBOARD AND DISPLAY PANEL

CROSS REFERENCE TO RELATED APPLICATION

This application is a US 371 application from PCT/EP2017/084661 entitled "Mainboard and Display Panel" filed on Dec. 27, 2017 and published as WO 2019/052679 A1 on Mar. 21, 2019, which claims priority to EP Application 17191647.1 filed on Sep. 18, 2017. The technical disclosures of every application and publication listed in this paragraph are hereby incorporated herein by reference.

TECHNICAL FIELD

The present disclosure relates to a mainboard for a display panel and a display panel having a mainboard.

BACKGROUND

It is common for display panels to be mounted or stood on a horizontal or substantially horizontal surface, such as a desk or table or dedicated stand or cabinet or the like. Especially in the case that the display panel is a television but also in some other display panels, it is common for the sockets for video and audio input/output, etc. to face rearwards. However, the same display panel may also be mounted to a vertical or substantially vertical surface, such as a wall or pillar or vertical display stand or the like. In that case, as the rear of the display panel is often very close to the vertical surface, access to the sockets to connect and disconnect cables can be restricted or even impossible, which is inconvenient and frustrating for the user.

SUMMARY

According to an aspect disclosed herein, there is provided a mainboard for a display panel, the mainboard comprising:
at least one socket for receiving a cable;
the socket being rotatable between first and second orientations.

In an example, the mainboard comprises plural sockets which are rotatable between first and second orientations.

In an example, the plural sockets are arranged so as to rotate together between the first and second orientations.

The rotatable sockets may be all of the sockets that are provided on the mainboard. Alternatively, there may be some sockets on the mainboard that are rotatable and some sockets that are not rotatable. As one specific example, a power socket of the mainboard may be fixed whereas any video and audio input/output sockets may be rotatable.

In an example, the rotatable sockets are mounted on a carrier which is rotatably mounted to a main portion of the mainboard so that the plural sockets rotate together as the carrier rotates.

In an example, in the first orientation a cable-receiving portion of the or each rotatable socket faces rearwards of the mainboard and in the second orientation the cable-receiving portion of the or each rotatable socket faces sideways of the mainboard.

There may also be provided a display device comprising a mainboard as described above.

In an example, the display device comprises:
a motor for rotating the or each rotatable socket between the first and second orientations.

In an example, the display device comprises:
a proximity sensor for sensing proximity of the display device to a surface; and
a controller for controlling operation of the motor, the controller being arranged to cause the motor to rotate the or each rotatable socket between the first and second orientations depending on the proximity of the display device to a said surface.

For example, if the proximity sensor senses that the display device is close to a surface (such as a wall), then the controller may cause the or each rotatable socket to be rotated to face sideways of the display device. Likewise, if the proximity sensor senses that the display device is not close to a surface (such as a wall), then the controller may cause the or each rotatable socket to be rotated to face rearwards of the display device.

In an example, the display device comprises a biasing arrangement for biasing the or each rotatable socket to one of the orientations.

BRIEF DESCRIPTION OF THE DRAWINGS

To assist understanding of the present disclosure and to show how embodiments may be put into effect, reference is made by way of example to the accompanying drawings in which.

DETAILED DESCRIPTION

Figure 1:
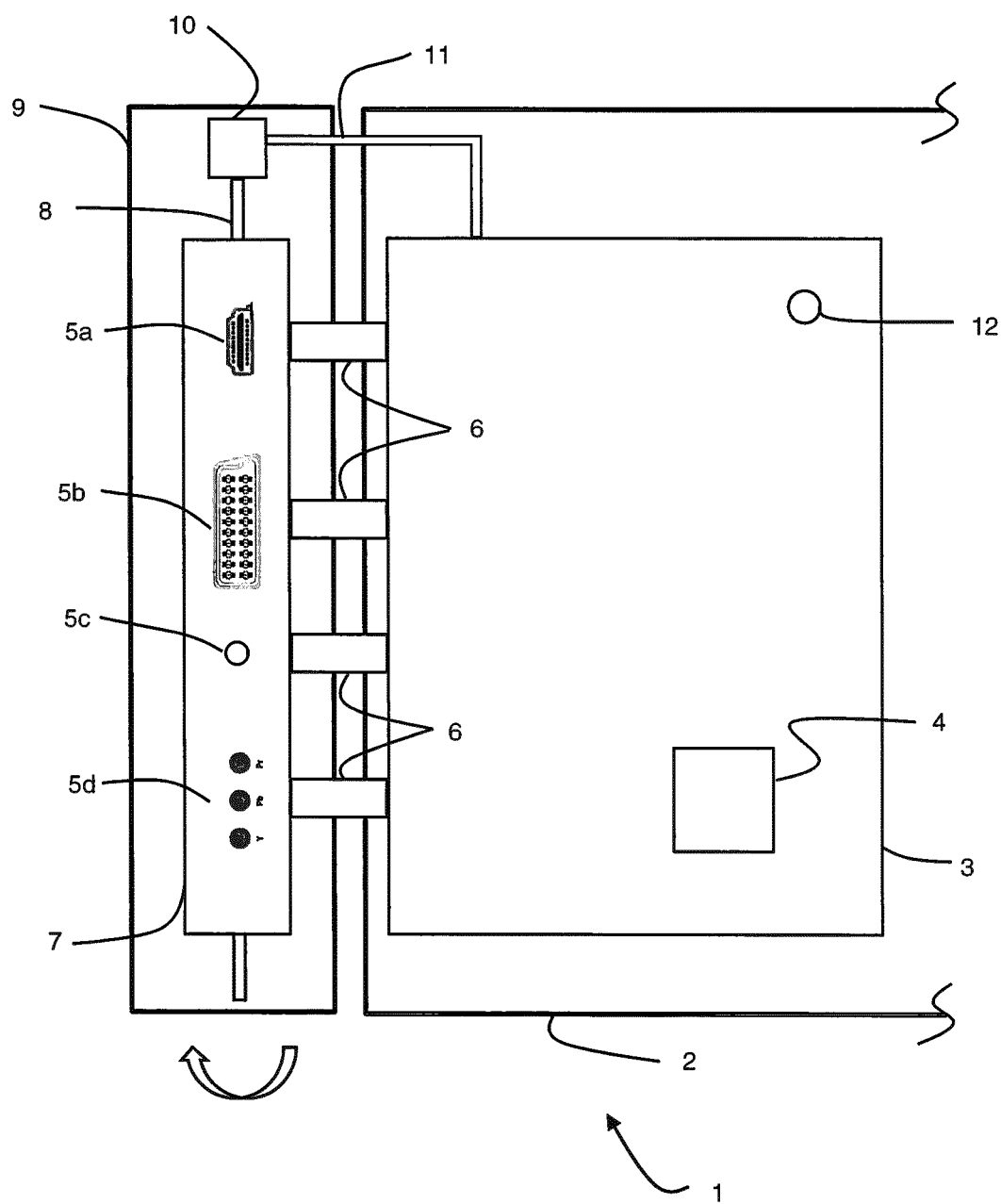
FIG. 1 shows schematically a portion of an example of a display panel and mainboard as described herein in a first configuration.

Many display panels, including display panels for connection to a computer or the like or a display panel of a television or digital "signage" and the like, have a mainboard. The mainboard is an electronic circuit, similar to a computer's motherboard, which acts inter alia to set the basic specifications of the display panel and to control operation of the display panel generally. The mainboard typically has a number of different components, including for example a main processor and video and audio processors.

As mentioned above, it is common for display panels to be mounted or stood on a horizontal or substantially horizontal surface, such as a desk or table or dedicated stand or cabinet or the like. Especially in the case that the display panel is a television but also in some other display panels, it is common for the sockets for video and audio input/output, etc. to face rearwards. This is often preferred by users as it enables easy access to the sockets to connect and disconnect cables whilst at the same time making it easier to "hide" the cables behind the display panel. In contrast, some televisions for example have some sockets that face rearwards and some sockets that face outwards to the side of the television. If cables are connected to the sideways-facing sockets, the cables inevitably project outwards to the side and are therefore highly visible. In any event, for some display panels including in particular televisions, it is preferred by users that the sockets face rearwards.

However, the same display panel may also be mounted to a vertical or substantially vertical surface, such as a wall or pillar or vertical display stand or the like. In that case, as the rear of the display panel is often very close to the vertical surface, access to the rearwardly-facing sockets to connect and disconnect cables can be restricted or even impossible, which is inconvenient and frustrating for the user. Indeed, the rearwardly-facing sockets are typically not even visible to the user once the display panel is mounted on a wall or the like, which further makes it difficult for the user to connect a cable to the correct socket.

In examples described herein, a motherboard for a display panel has at least one socket for receiving a cable, the socket being rotatable between first and second orientations. As a particular example, the socket is rotatable so as to be able to face selectively rearwards of the mainboard or sideways of the mainboard. In this regard, it will be understood that "rearwards" or the like as used herein is intended to mean generally perpendicular to the main plane of the mainboard and in a direction that is to the rear of the display panel in which the mainboard is used, and correspondingly "sideways" or the like as used herein is intended to mean generally in or parallel to the main plane of the mainboard and in a direction that is away from the body of the mainboard. In this example therefore, the rotatable socket may be rotatable through 90° or so.

Specific examples will now be described with reference to the drawings, in which FIGS. 1 and 2 respectively show schematically a portion of an example of a display panel and mainboard in first and second configurations.

In the drawings, there is shown a rear view of a portion of a display panel 1. The display panel 1 may be for connection to a computer or the like or a display panel of a television or digital "signage", etc. The display panel 1 has a main outer housing 2, a portion of which is shown. In the drawings, a mainboard 3 for the display panel 1 is indicated, it being understood that in practice the mainboard 3 will be located within the housing 2 and therefore not visible. The mainboard 3 typically has a number of different components, including for example a main processor and video and audio processors, indicated schematically at 4.

The display panel 1 has a number of sockets 5 to which cables may be connected. The sockets 5 may include one or more of the many different types of sockets that are present in display panels 1. By way of example only, the sockets shown include an HDMI (High-Definition Multimedia Interface) socket 5a, a SCART (Syndicat des Constructeurs d'Appareils Radiorécepteurs et Téléviseurs) socket 5b, a digital audio out socket 5c (which may be optical or electrical) and a set of component video sockets 5d. Not all of these sockets need be present and other, different sockets may be present, including for example for analogue audio, VGA (Video Graphics Array), DVI (Digital Visual Interface), etc., etc. In general, the sockets may be for input or output or both input and output of signals, including video and audio signals. There may also be a mains power socket to which a mains power cable can be connected.

At least some of the sockets 5 are arranged so as to be rotatable with respect to the mainboard 3. In some examples, all sockets 5 of the display panel 1 are rotatable with respect to the mainboard 3. In other examples, all sockets 5 of the display panel 1 other than a mains power socket are rotatable with respect to the mainboard 3. The rotatable sockets 5 are each connected to the main portion of the mainboard 3 by flexible cables 6 so that signals can pass between the processors or other components 4 of the mainboard 3 and the sockets 5 whilst allowing the sockets 5 to rotate. (Whilst located separately of the main portion of the mainboard 3, the rotatable sockets 5 may be regarded as being part of the mainboard 3, given that, conventionally, mainboards for display panels are typically supplied by mainboard manufacturers with sockets already fitted.)

In the example shown, the rotatable sockets 5 are mounted on a carrier 7, which may be in the form of a bracket or panel or the like. The carrier 7 is mounted on a shaft 8, which enables the carrier 7 and therefore the sockets 5 to rotate with respect to the main portion of the mainboard 3. A separate cover 9 may be fixed to the carrier 7 so as to rotate with the carrier 7. The cover 9 acts as an extension of the housing 2 of the display panel 1.

In one example, the carrier 7 and the sockets 5 may be manually rotated by a user as desired so as to change the orientation of the sockets 5.

In particular, in the orientation shown in FIG. 1, the sockets 5 face rearwards of the mainboard 3 and display panel 2. That is, the cable-receiving portions of the sockets 5 face rearwards of the mainboard 3 and display panel 2. This orientation of the sockets 5 is likely to be most convenient to a user when the display panel 1 is mounted or stood on a horizontal surface as it allows easy access to the sockets 5 whilst also allowing the cables to be more easily hid from view when the screen of the display panel 1 is being viewed from the front.

Figure 2:
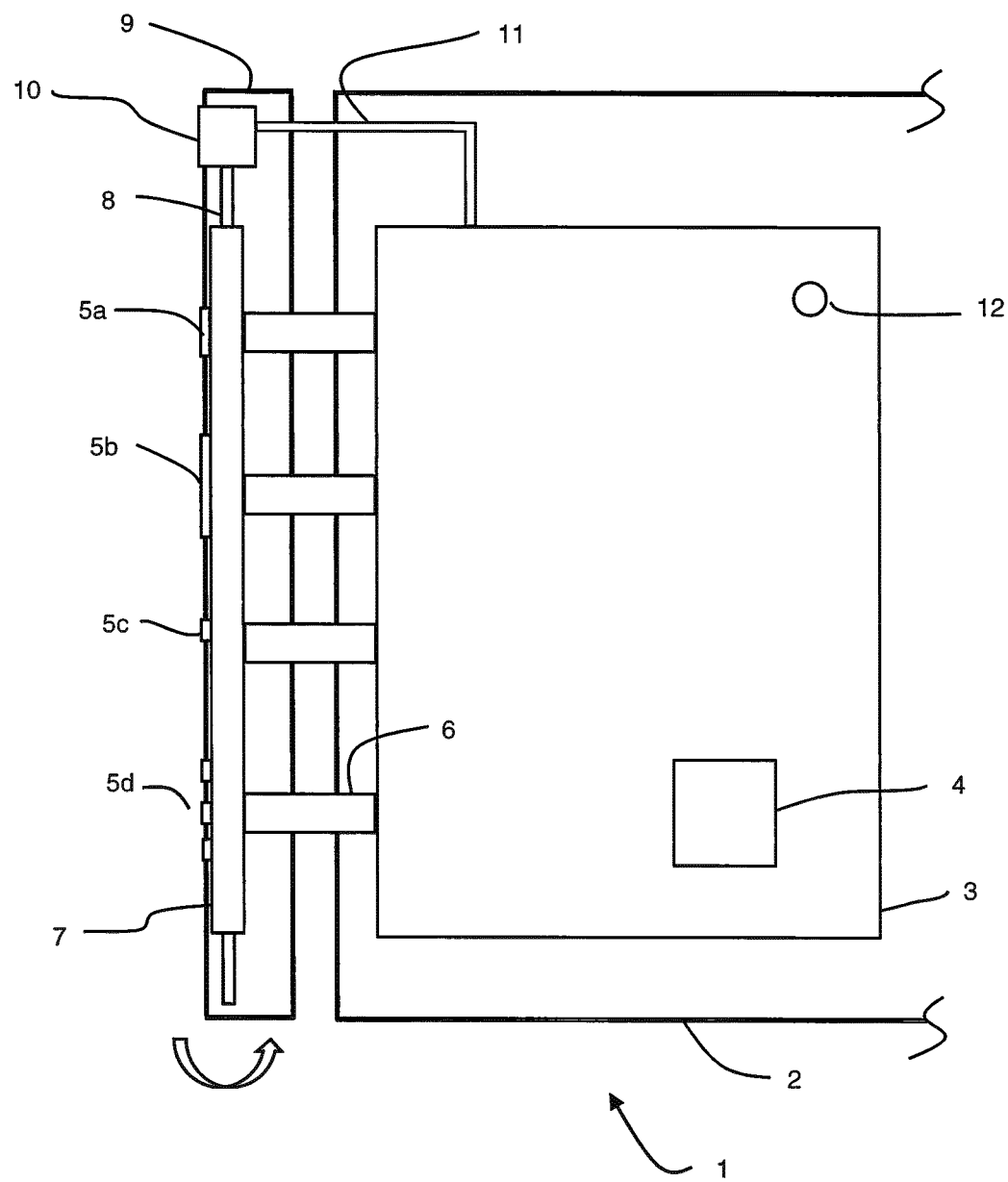
FIG. 2 shows schematically a portion of the example of FIG. 1 in a second configuration.

On the other hand, in the orientation shown in FIG. 2, the sockets 5 face sideways of the mainboard 3 and display panel 2. That is, the cable-receiving portions of the sockets 5 face outwardly of a side or edge of the mainboard 3 and display panel 2. This orientation of the sockets 5 is likely to be most convenient to a user when the display panel 1 is mounted on a vertical surface such as a wall or other vertical display surface as it allows easy access to the sockets 5 as the wall or other vertical will then not obstruct the sockets 5 and also the sockets 5 are visible to the user.

As an alternative or in addition to the sockets 5 being manually rotatable, rotation of the sockets 5 between one orientation and another may be driven by an electric motor 10. In the example shown, the electric motor 10 is connected to the shaft 8 of the carrier 7 to drive rotation of the sockets 5.

The motor 10 may be connected by a cable 11 to a processor 4 of the mainboard 3. The processor 4 may in one example be arranged to provide an option in a display menu or the like which is displayed on a display screen of the display panel 1 and by which the user can select the desired orientation of the sockets 5.

Alternatively or additionally, in an example the rotation of the sockets 5 may be carried out automatically. For example, the mainboard 3 or the display panel 1 may have a proximity sensor 12 which is able to sense proximity of the display panel 1 to a surface, such as a wall. As is known, a proximity sensor is a sensor that is able to detect the presence of nearby objects or "targets" without any physical contact. Many different types of proximity sensor that are suitable for use herein are known. For example, a photoelectric proximity sensor 12 may be used, the photoelectric proximity sensor 12 having for example a photodiode or other light emitter that emits an electromagnetic field or a beam of electromagnetic radiation (e.g. infrared), and looks for changes in the field or return signal. Under control of for example the processor 4, if the proximity sensor 12 detects that the display panel 1 is close to a wall or the like, then the processor 4 may cause the motor 10 to rotate the sockets 5 to face sideways (as in FIG. 2). On the other hand, if the proximity sensor 12 detects that the display panel 1 is not close to a wall or the like, then the processor 4 may cause the motor 10 to rotate the sockets 5 to face rearwards (as in FIG. 1). The threshold distance may be fixed or may be set by a user. The threshold distance may be a matter of a few millimetres to a few centimeters say.

In the case that there is automatic control of rotation of the sockets 5, the user may be provided with an option to disable the automatic operation. This may be provided by for example a menu option or the like which is displayed on a display screen of the display panel 1.

In other examples, a biasing arrangement may be provided to bias the rotatable sockets 5 to one orientation or the other. For example, a spring arrangement may be provided so as to bias the carrier 7 described above such that the default or rest orientation is with the sockets facing rearwards as in FIG. 1 or such that the default or rest orientation is with the sockets facing sideways as in FIG. 2. Such a spring arrangement may be provided between the main part of the mainboard 3 and the carrier 7 in this example. There may be a lock or catch mechanism which locks the carrier 7 in the other, non-rest orientation and which can be released by a user when it is desired to allow the carrier 7 to revert to the rest orientation under operation of the biasing arrangement.

It will be understood that the processor or processing system or circuitry referred to herein may in practice be provided by a single chip or integrated circuit or plural chips or integrated circuits, optionally provided as a chipset, an application-specific integrated circuit (ASIC), field-programmable gate array (FPGA), digital signal processor (DSP), graphics processing units (GPUs), etc. The chip or chips may comprise circuitry (as well as possibly firmware) for embodying at least one or more of a data processor or processors, a digital signal processor or processors, baseband circuitry and radio frequency circuitry, which are configurable so as to operate in accordance with the exemplary embodiments. In this regard, the exemplary embodiments may be implemented at least in part by computer software stored in (non-transitory) memory and executable by the processor, or by hardware, or by a combination of tangibly stored software and hardware (and tangibly stored firmware).

The examples described herein are to be understood as illustrative examples of embodiments of the invention. Further embodiments and examples are envisaged. Any feature described in relation to any one example or embodiment may be used alone or in combination with other features. In addition, any feature described in relation to any one example or embodiment may also be used in combination with one or more features of any other of the examples or embodiments, or any combination of any other of the examples or embodiments. Furthermore, equivalents and modifications not described herein may also be employed within the scope of the invention, which is defined in the claims.

The invention claimed is:

1. A display device, the display device comprising:
    a mainboard, the mainboard comprising at least one socket configured to receive a cable,
    the socket being rotatable between first and second orientations;
    a motor configured to rotate the or each rotatable socket between the first and second orientations;
    a proximity sensor arranged and configured to sense proximity of the display device to a first surface when the first surface is positioned rearwards of the display device; and
    a controller configured to control operation of the motor;
    the mainboard, the motor, the proximity sensor, and the controller being arranged and configured to provide an automatic operation mode so that:
    the controller causes the motor to rotate the or each rotatable socket to the first orientation if the proximity of the display device to said first surface as sensed by the proximity sensor is not within a threshold distance such that the or each rotatable socket is accessible to receive a cable in the first orientation, and
    the controller causes the motor to rotate the or each rotatable socket to the second orientation if the proximity of the display device to said first surface as sensed by the proximity sensor is within the threshold distance such that the or each rotatable socket is accessible to receive a cable in the second orientation.

2. A display device according to claim 1, comprising plural sockets which are rotatable between first and second orientations.

3. A display device according to claim 2, wherein the plural sockets are arranged so as to rotate together between the first and second orientations.

4. A display device according to claim 3, wherein in the first orientation a cable-receiving portion of each rotatable socket faces rearwards of the display device and in the second orientation the cable-receiving portion of each rotatable socket faces sideways of the display device.

5. A display device according to claim 3, comprising a biasing arrangement configured to bias the rotatable sockets to one of the orientations.

6. A display device according to claim 2, wherein the rotatable sockets are mounted on a carrier which is rotatably mounted to a main portion of the mainboard so that the plural sockets rotate together as the carrier rotates.

7. A display device according to claim 6, wherein in the first orientation a cable-receiving portion of each rotatable socket faces rearwards of the display device and in the second orientation the cable-receiving portion of each rotatable socket faces sideways of the display device.

8. A display device according to claim 6, comprising a biasing arrangement configured to bias the rotatable sockets to one of the orientations.

9. A display device according to claim 1, wherein in the first orientation a cable-receiving portion of the or each rotatable socket faces rearwards of the display device and in the second orientation the cable-receiving portion of the or each rotatable socket faces sideways of the display device.

10. A display device according to claim 1, comprising a biasing arrangement configured to bias the or each rotatable socket to one of the orientations.

11. A display device according to claim 10, wherein in the first orientation a cable-receiving portion of the or each rotatable socket faces rearwards of the display device and in the second orientation the cable-receiving portion of the or each rotatable socket faces sideways of the display device.

12. A display device according to claim 1, wherein the display device is configured so that the display device is capable of being mounted to a vertical surface.

13. A display device according to claim 12, wherein the display device is configured so that the display device is capable of being mounted to the vertical surface in a device arrangement such that the vertical surface is adjacent to and rearwards of the display device.

14. A display device according to claim 13, wherein the display device is configured to provide the user with an option to disable the automatic operation mode.

15. A display device according to claim 1, wherein the display device is configured so that the display device is capable of being mounted to a vertical surface in a device arrangement such that the vertical surface is adjacent to and rearwards of the display device.

16. A display device according to claim 1, wherein the display device is configured to provide the user with an option to disable the automatic operation mode.

* * * * *